United States Patent
Teranishi

(10) Patent No.: US 12,512,314 B2
(45) Date of Patent: Dec. 30, 2025

(54) PROCESSING METHOD OF WAFER

(71) Applicant: DISCO CORPORATION, Tokyo (JP)

(72) Inventor: Shunsuke Teranishi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 407 days.

(21) Appl. No.: 18/366,881

(22) Filed: Aug. 8, 2023

(65) Prior Publication Data

US 2024/0071753 A1     Feb. 29, 2024

(30) Foreign Application Priority Data

Aug. 23, 2022   (JP) ................................ 2022-132236

(51) Int. Cl.
    *H01L 21/02*       (2006.01)
    *H01L 21/683*      (2006.01)

(52) U.S. Cl.
    CPC .... *H01L 21/02315* (2013.01); *H01L 21/6836* (2013.01); *H01L 2221/68381* (2013.01)

(58) Field of Classification Search
    CPC ........... H01L 21/02315; H01L 21/6836; H01L 2221/68381
    See application file for complete search history.

(56) References Cited

U.S. PATENT DOCUMENTS

| 2014/0116615 A1* | 5/2014 | Ogawa | .................. | C09J 143/04 |
| | | | | 156/709 |
| 2016/0122601 A1* | 5/2016 | Bai | ........................ | C09J 171/02 |
| | | | | 428/352 |
| 2022/0319910 A1* | 10/2022 | Larrey | ............. | H01L 21/76243 |

FOREIGN PATENT DOCUMENTS

JP        2004153193 A      5/2004

\* cited by examiner

*Primary Examiner* — Brian Turner
(74) *Attorney, Agent, or Firm* — Greer Burns & Crain Ltd.

(57) ABSTRACT

In a processing method of a wafer having a front surface and a back surface on a side opposite to the front surface, a support substrate having a support surface that supports the wafer is provided, a hydrophilic treatment is performed on at least one of the front surface of the wafer or the support surface of the support substrate, the front surface of the wafer and the support surface of the support substrate are brought to face each other and are joined together to form a joined wafer, the joined wafer is heated to a first temperature, the wafer included in the joined wafer is processed from a side of the back surface, the joined wafer is heated to a second temperature higher than the first temperature, and the wafer is then separated from the support substrate.

8 Claims, 12 Drawing Sheets

PROCESSING METHOD OF WAFER

BACKGROUND OF THE INVENTION

Field of the Invention

The present invention relates to a processing method of a wafer which has a plurality of devices formed on a side of a front surface thereof, by joining the wafer to a support substrate, processing the wafer joined with the support substrate, and separating the thus-processed wafer from the support substrate.

Description of the Related Art

Chips of devices such as integrated circuits (ICs) are essential elements in various types of electronic equipment such as mobile phones and personal computers. These chips are manufactured, for example, by grinding a wafer on a side of a front surface of which a plurality of devices are formed, to a desired thickness and then forming, along boundaries of the devices, dividing grooves through the wafer. To provide chips of higher capacity and smaller size, a technology has been realized in recent years to stack and integrate a plurality of chips such as dynamic random access memories (DRAMs). This technology requires to thin individual chips which are to be stacked, to a thickness of 10 µm or smaller in advance. It is however not easy to handle a wafer after it has been thinned to such a thickness. A method which bonds a support substrate to a wafer before its thinning, with an adhesive material that can be separated later (see JP 2004-153193A) is hence used. Along with further thinning of wafers, there is also a growing demand for improvements in thickness homogeneity and planarity (total thickness variation (TTV)) of thinned wafers. Described specifically, a planarity of 0.5 µm or smaller is required for wafers thinned to 10 µm.

SUMMARY OF THE INVENTION

When a wafer is bonded to a support substrate with an adhesive material, however, finishing of the wafer with a high planarity needs not only to use a support substrate having an extremely high planarity but also to form, with the adhesive material, a layer having an extremely high planarity. The support substrate having an extremely high planarity is obtained by processing a support substrate with a grinding machine in advance. On the other hand, it is not easy to increase the planarity of the adhesive material applied to the support substrate or the like. When ultraviolet light is applied to cure an adhesive material after the adhesive material is held between a support substrate and a wafer, for example, uneven shrinkage of the adhesive material occurs. The resulting adhesive material layer therefore tends to have a low planarity.

The present invention therefore has as an object thereof provision of a wafer processing method in which a wafer joined with a support substrate can be processed in such a manner that the wafer has a high planarity.

In accordance with an aspect of the present invention, there is provided a processing method of a wafer having a front surface and a back surface on a side opposite to the front surface. The processing method includes a providing step of providing a support substrate having a support surface that supports the wafer, a hydrophilization step of performing a hydrophilic treatment on at least one of the front surface of the wafer or the support surface of the support substrate, a joining step of, after the hydrophilization step, bringing the front surface of the wafer and the support surface of the support substrate to face each other, and joining the front surface and the support surface together to form a joined wafer, a first heating step of heating the joined wafer to a first temperature, thereby increasing a joint strength between the wafer and the support substrate, a processing step of, after the first heating step, processing the wafer included in the joined wafer, from a side of the back surface, a second heating step of, after the processing step, heating the joined wafer to a second temperature higher than the first temperature, thereby reducing the joint strength between the wafer and the support substrate, and a separation step of, after the second heating step, separating the wafer from the support substrate.

Preferably, in the hydrophilization step, the at least one of the front surface of the wafer or the support surface of the support substrate, the at least one surface having been subjected to the hydrophilic treatment, may have a contact angle of 10° or greater and 50° or smaller with dropped pure water.

Preferably, in the hydrophilization step, the hydrophilic treatment may be performed in an outer peripheral region of the at least one of the front surface of the wafer or the support surface of the support substrate, and the hydrophilic treatment may not be performed on an inner side of the outer peripheral region.

Preferably, in the first heating step, the joined wafer may be heated in an outer peripheral region thereof.

Preferably, in the second heating step, the joined wafer may be heated in the outer peripheral region thereof.

Preferably, the hydrophilization step may apply the hydrophilic treatment by bringing plasma that has been generated under atmospheric pressure, into contact with the at least one of the front surface of the wafer or the support surface of the support substrate.

Preferably, the support surface of the support substrate may have a profile corresponding to the front surface of the wafer.

Preferably, the first temperature may be 150° C. or higher and lower than 250° C., and the second temperature may be 250° C. or higher and 350° C. or lower.

In the processing method according to the aspect of the present invention, the hydrophilic treatment is performed in advance on the at least one of the front surface of the wafer or the support surface of the support substrate, and the front surface of the wafer and the support surface of the support substrate are then brought to face each other, and are joined together to form the joined wafer. After the wafer included in the joined wafer is processed from the side of the back surface, the wafer is separated from the support substrate. According to this method, the wafer can be supported on the support substrate without using any adhesive material. The wafer supported on the support substrate can therefore be processed without occurrence of reductions in the thickness homogeneity and planarity, which may be induced if an adhesive material layer were included.

According to the aspect of the present invention, it is hence possible to provide a wafer processing method in which a wafer joined with a support substrate can be processed in such a manner that the wafer has a high planarity.

The above and other objects, features and advantages of the present invention and the manner of realizing them will become more apparent, and the invention itself will best be understood from a study of the following description and

DETAILED DESCRIPTION OF THE PREFERRED EMBODIMENT

With reference to the attached drawings, a description will be made with regard to an embodiment of the present invention. FIG. 1B is a perspective view schematically illustrating a wafer 1 to be processed by a processing method according to the present embodiment. The wafer 1 is formed in a disk shape from, for example, a semiconductor material such as silicon (Si). On a front surface 1a of the wafer 1, a plurality of intersecting scribe lines 3 are set, and devices 5 are formed in respective regions defined by the scribe lines 3 on the front surface 1a of the wafer 1. The devices 5 each include an element for constituting, for example, an IC, a semiconductor memory, or an image sensor. Boundaries of the devices 5 extend, for example, in a grid pattern. When the wafer 1 is diced along the scribe lines 3, device chips can be manufactured with devices 5 individually included therein. It is to be noted that no limitation is imposed on the material, shape, construction, size, or the like of the wafer 1.

The wafer 1 may be formed from a semiconductor material other than Si (for example, silicon carbide (SiC), gallium nitride (GaN), or the like). Similarly, no limitation is imposed either on the type, number, shape, construction, size, arrangement, or the like of the devices 5.

The wafer 1 is chamfered at an outer peripheral edge thereof, in other words, a chamfered portion is formed on the outer peripheral edge of the wafer 1. Described specifically, the wafer 1 has a side wall curved to protrude outwardly. In the wafer 1, the front surface 1a and a back surface 1b on a side opposite to the front surface 1a are parallel to each other, and localized variations in thickness are extremely small. Over the front surface 1a of the wafer 1, an insulating film may be disposed covering the devices 5. The insulating film is configured of, for example, a silicon oxide film ($SiO_2$ film), a silicon nitride film (SiN film), a silicon oxynitride film (SiON film), a silicon carbide nitride film (SiCN film), an organic resin film, or the like. The insulating film that covers the devices 5 may be planarized at an upper surface thereof by such a method as chemical mechanical polishing (CMP). If the upper surface has been planarized, the front surface 1a of the wafer 1 has extremely reduced irregularities.

Figure 1A:
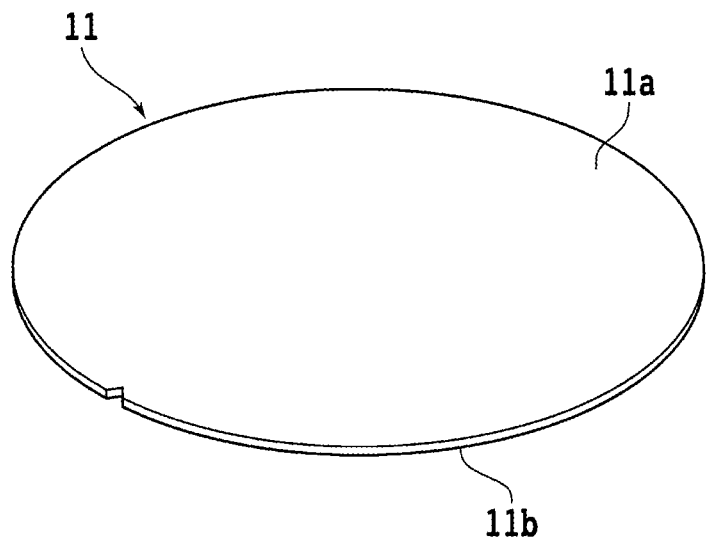
FIG. 1A is a perspective view schematically illustrating a support substrate.
Figure 1B:
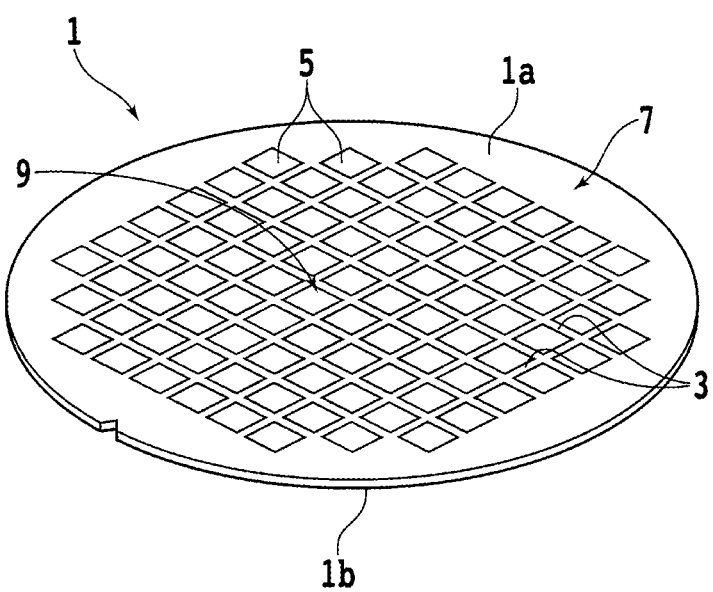
FIG. 1B is a perspective view schematically illustrating an example of a wafer.

FIG. 1A is a perspective view schematically illustrating an example of a support substrate 11 to be joined to the wafer 1. In the processing method according to the present embodiment for the wafer 1, the support substrate 11 is joined to a side of the front surface 1a of the wafer 1 to form a joined wafer such that the devices 5 and the like are protected, and the wafer 1 is processed while being included in the joined wafer.

A description will be made with regard to the support substrate 11. The support substrate 11 has a profile corresponding to the front surface 1a of the wafer 1. For example, the support substrate 11 is formed in a disk shape similar to the shape of the wafer 1. As the support substrate 11, one equivalent to the wafer 1 on which the devices 5 have not yet been formed can be used, for example. The support substrate 11 is however not limited to such. The support substrate 11 has a support surface 11a that supports the wafer 1 and a back surface 11b on a side opposite to the support surface 11a. The support surface 11a and the back surface 11b of the support substrate 11 have extremely small irregularities and are planar like the front surface 1a and the back surface 1b of the wafer 1 such that the wafer 1 supported on the support substrate 11 is appropriately processed. Further, the support surface 11a and the back surface 11b of the support substrate 11 are parallel to each other, and the support substrate 11 also has extremely small localized variations in thickness.

In the related art, an adhesive material has been used when a support substrate 11 is bonded to a wafer 1. It is however not easy to form an adhesive layer, which is held between the wafer 1 and the support substrate 11, with a uniform thickness. When ultraviolet light is applied to cure the adhesive material after the adhesive material is held between the wafer 1 and the support substrate 11, uneven shrinkage of the adhesive material may occur, and therefore, the resulting adhesive material layer tends to have a low planarity. Even if the wafer 1 and the support substrate 11 are bonded together to form a bonded wafer and the wafer 1 is processed in the form of the bonded wafer, the wafer 1 cannot be processed with high precision due to the adhesive layer. In the processing method of the present embodiment, the wafer 1 and the support substrate 11 are hence joined without using any adhesive material, and the wafer 1 is then processed. A description will hereinafter be made in detail with regard to the processing method according to the present embodiment.

Figure 12:
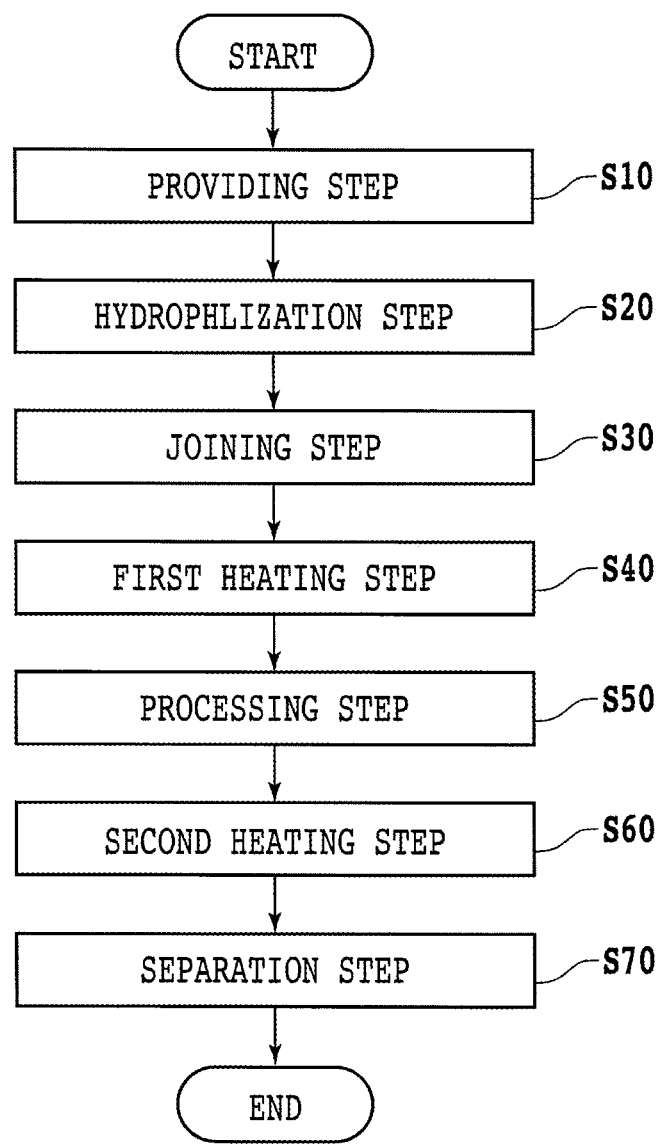
FIG. 12 is a flow chart illustrating a flow of the processing method according to the embodiment of the present invention.

FIG. 12 is a flow chart illustrating a flow of individual steps of the processing method of the present embodiment. In the processing method of the present embodiment as illustrated in FIG. 12, a providing step S10 is first performed to provide the support substrate 11 having the support surface 11a that supports the wafer 1. For example, a wafer which is also usable for the manufacture of device chips and on which no devices 5 are formed is provided as the support substrate 11 in the providing step S10. As an alternative, a wafer which includes devices formed thereon but has been found to be a defective product for some reason may be processed such that the devices are removed from the wafer and the wafer is planarized, to provide the support substrate 11. As appreciated from the foregoing, no restriction is imposed on the manner of procurement of the support substrate 11.

In the providing step S10, an evaluation may be made for the size of formed irregularities, in other words, a planarity, with respect to the support surface 11a and the back surface 11b of the support substrate 11. An evaluation may also be made on the degree of parallelism between the support surface 11a and the back surface 11b of the support substrate 11, in other words, the thickness homogeneity of the support substrate 11. In the providing step S10, such processing as CMP may also be performed on the support substrate 11 such that the planarity and thickness homogeneity satisfy predetermined levels. Here, a specific description is made with regard to an example of a planarity required for the support surface 11a of the support substrate 11 to be provided in the providing step S10. Desirably, the support surface 11a of the support substrate 11 has, for example, a surface roughness (Rms) of 3 nm or smaller. If the surface roughness (Rms) of the support surface 11a is 3 nm or smaller, the support surface 11a of the support substrate 11 can be joined well to the front surface 1a of the wafer 1 as will be described subsequently herein.

In the providing step S10, if the planarity of the front surface 1a of the wafer 1 on which the devices 5 are formed (or the upper surface of an insulating film covering the devices 5, if arranged) does not satisfy the predetermined level, such processing as CMP may be performed on the front surface 1a of the wafer 1 to improve its planarity. Described in more detail, CMP may be performed on the front surface 1a of the wafer 1 over a thickness of approximately 50 nm with use of a slurry that is employed in CMP for removal of barrier metals on semiconductor devices. As an alternative, a wafer on which such CMP has been performed is provided as the wafer 1 in the providing step S10.

Figure 2:
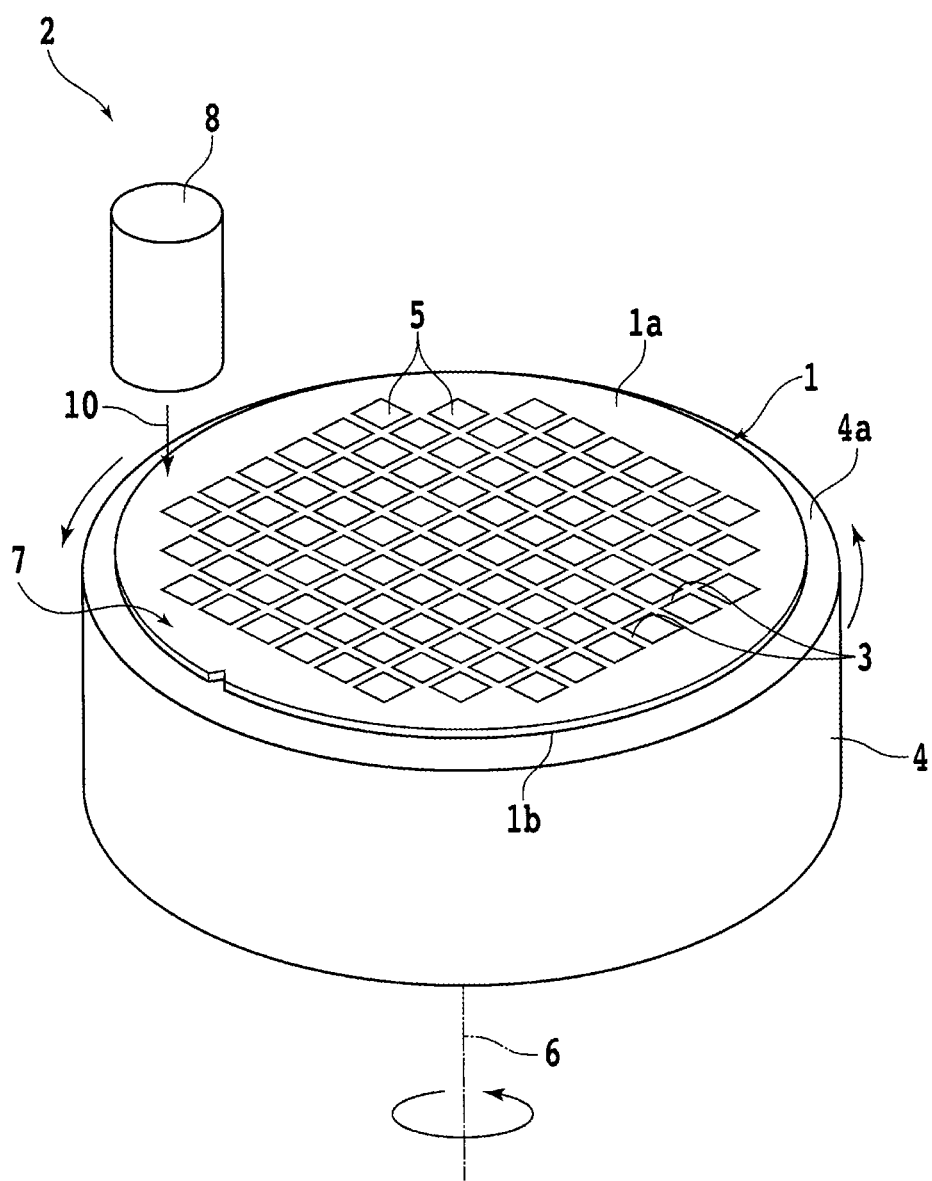
FIG. 2 is a perspective view schematically illustrating a hydrophilization step in a wafer processing method according to an embodiment of the present invention.

In preparation for joining the wafer 1 and the support substrate 11, a hydrophilization step S20 is next performed to apply a hydrophilic treatment to at least one of the front surface 1a of the wafer 1 or the support surface 11a of the support substrate 11. In the hydrophilization step S20, the hydrophilic treatment is applied by bringing plasma which has been generated under atmospheric pressure (atmospheric pressure plasma) into contact with the at least one of the front surface 1a of the wafer 1 or the support surface 11a of the support substrate 11. Taking as an example a case in which the hydrophilic treatment is performed on the front surface 1a of the wafer 1, a description will hereinafter be made. FIG. 2 is a perspective view schematically illustrating the wafer 1 on the front surface 1a of which the hydrophilic treatment is being performed. Illustrated in FIG. 2 is an atmospheric pressure plasma irradiation device 2 that performs atmospheric pressure plasma irradiation as an example of the hydrophilic treatment.

The atmospheric pressure plasma irradiation device 2 includes a plasma irradiation unit 8 that can apply plasma 10 to the wafer 1 which is placed on a rotating support table 4, under atmospheric pressure. An upper surface of the rotating support table 4 serves as a holding surface 4a, and can preferably hold the wafer 1 placed on the holding surface 4a. For example, the rotating support table 4 holds the wafer 1 by suction with a negative pressure caused to act on the wafer 1 placed on the holding surface 4a. The rotating support table 4 is connected to a rotary drive source (not illustrated) such as a motor, and can therefore rotate about an axis 6 of table rotation that is substantially perpendicular to the holding surface 4a. The plasma irradiation unit 8 is arranged above an outer peripheral edge of the holding surface 4a of the rotating support table 4, and has a function to apply the plasma 10 toward the holding surface 4a. Now, a description is made with regard to a configuration of the plasma irradiation unit 8. As the plasma irradiation unit 8, a plasma generator "CeraPlas (registered trademark) element" (manufactured by TDK Electronics AG) can be used, for example. However, the plasma irradiation unit 8 is not limited to this plasma generator, and a desired plasma generator that can form the plasma 10 under atmospheric pressure can also be used.

In the hydrophilization step S20, the wafer 1 is placed on the holding surface 4a of the rotating support table 4, for example, with the front surface 1a, as a surface to be joined, of the wafer 1 directed upward, and the wafer 1 is held by suction on the rotating support table 4. The rotating support table 4 is then rotated one turn or more about the axis 6 of table rotation while the plasma 10 is applied from the plasma irradiation unit 8 to the front surface 1a of the wafer 1 under predetermined conditions. The front surface 1a of the wafer 1 is hence subjected to the hydrophilic treatment in an outer peripheral region 7. A description will next be made with regard to an example of plasma irradiation conditions in the hydrophilization step S20. For example, plasma is generated in air as a gas species at the plasma irradiation unit 8, and the plasma 10 is emitted at a flow rate of 50 sccm. A distance from an emission hole of the plasma irradiation unit 8 to the front surface 1a of the wafer 1 is set to approximately 10 mm, and the plasma is applied to a region of an approximately 10 mm diameter on the front surface 1a of the wafer 1. With an outer peripheral edge of a plasma irradiation region positioned at the outer peripheral edge of the front surface 1a of the wafer 1, the rotating support table 4 is then rotated at a rotation speed of 3° or greater and 30° or smaller per minute.

It is to be noted that the hydrophilic treatment may be performed on the support surface 11a of the support substrate 11 instead of the front surface 1a of the wafer 1. The hydrophilic treatment may also be performed on both the front surface 1a of the wafer 1 and the support surface 11a of the support substrate 11. Procedures for performing the hydrophilic treatment on the support surface 11a of the support substrate 11 are similar to the above-mentioned procedures that perform the hydrophilic treatment on the front surface 1a of the wafer 1. Conditions for applying the plasma to the support surface 11a of the support substrate 11 may be similar to the conditions under which the plasma is applied to the front surface 1a of the wafer 1. However, the plasma irradiation conditions in the hydrophilization step S20 are not limited to the foregoing. The plasma irradiation conditions are changeable within a range that provides the front surface 1a of the wafer 1 and/or the support surface 11a of the support substrate 11 with predetermined surface property. If the hydrophilic treatment is performed on both the front surface 1a of the wafer 1 and the support surface 11a of the support substrate 11, they do not need to be treated under the same conditions.

Here, a description will be made with regard to a phenomenon that occurs on the front surface 1a or the like of the wafer 1 by irradiation with atmospheric pressure plasma. Before irradiation with atmospheric pressure plasma, numerous airborne organic molecules are stuck on the wafer 1 or the like placed in the air. When atmospheric pressure plasma is applied to the front surface 1a or the like of the wafer 1, the organic molecules are decomposed or removed in an irradiated region, and further, airborne water molecules are stuck in the irradiated region. As a result, the front surface 1a of the wafer 1 is terminated with numerous hydroxyl groups (OH groups) in the irradiated region. This introduction of the hydroxyl groups to the front surface 1a or the like of the wafer 1 leads to an improvement in hydrophilicity of the front surface 1a or the like of the wafer 1. The degree of a progress of modification of the front surface 1a of the wafer 1 by the irradiation with plasma can therefore be evaluated in terms of the degree of hydrophilicity (wettability) in the region irradiated with the plasma, and can be parameterized by a contact angle of water to the front surface 1a or the like of the wafer 1 when water is dropped to the irradiated region. A detailed description will be made later with regard to preferred ranges of correlations between plasma irradiation conditions and the contact angle of water. Here, it is to be noted that organic molecules may be introduced in advance to the front surface 1a or the like of the wafer 1 to actively introduce hydroxyl groups by the hydrophilic treatment. For example, such liquid as ethanol, acetone, or acetic acid may be applied in advance to the front surface 1a of the wafer 1.

It is also to be noted that the hydrophilic treatment may be performed by another method. For example, the hydrophilic treatment may be performed by applying ultraviolet light to the front surface 1a or the like of the wafer 1 under predetermined conditions. In this case, organic molecules stuck on the front surface 1a or the like of the wafer 1 are also decomposed or removed by the irradiation with ultraviolet light, and hydroxyl groups likewise remain on the front surface 1a or the like of the wafer 1.

In the hydrophilization step S20, the hydrophilic treatment may be performed on the entirety of the front surface 1a or the like of the wafer 1. If this is the case, when the support substrate 11 is joined to the wafer 1 as will be mentioned later, the wafer 1 remains firmly supported on the support substrate 11 during its processing. If the hydrophilic treatment is applied to the entire area of the front surface 1a of the wafer 1, however, the wafer 1 may be firmly joined to the support substrate 11 in a device region 9, in which the devices 5 are formed, when the front surface 1a of the wafer 1 is joined to the support surface 11a of the support substrate 11. In this case, an excessively large load may be applied to the devices 5 when the support substrate 11 is finally separated from the wafer 1. In the hydrophilization step S20, it is therefore preferred to apply the hydrophilic treatment to the outer peripheral region 7, in which no devices 5 are formed, on the front surface 1a of the wafer 1, and not to perform the hydrophilic treatment on an inner side of the outer peripheral region 7. If the hydrophilic treatment is applied to the support surface 11a of the support substrate 11, on the other hand, the hydrophilic treatment may be applied to an outer peripheral region on the support surface 11a, the outer peripheral region not overlapping with the device region 9 of the wafer 1.

Figure 3A:
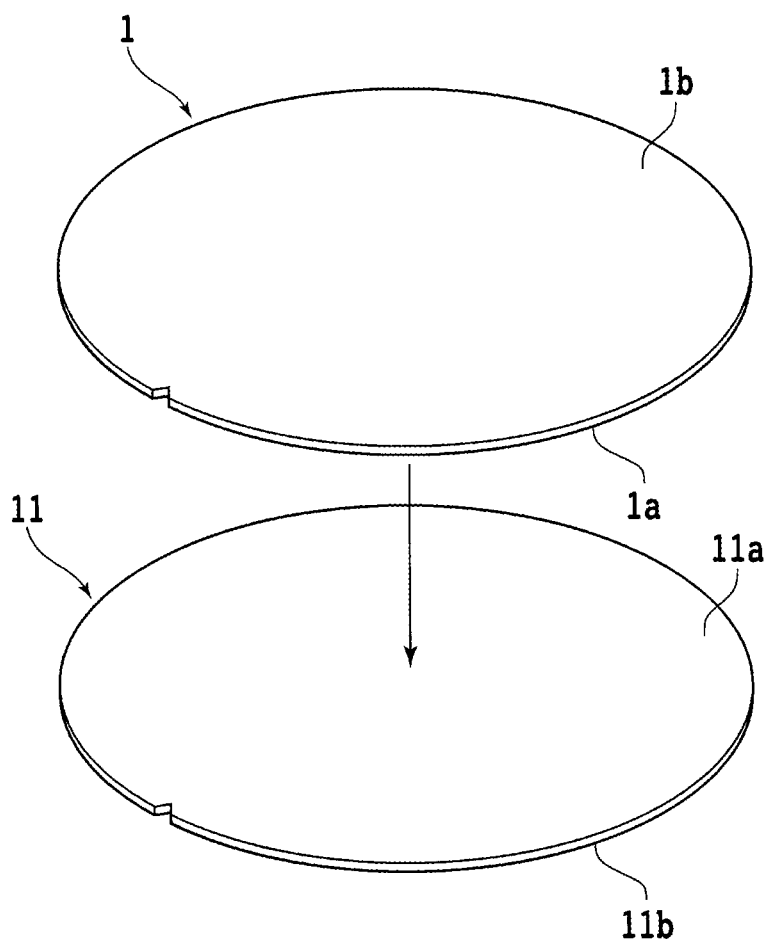
FIG. 3A is a perspective view schematically illustrating a joining step in the processing method.
Figure 3B:
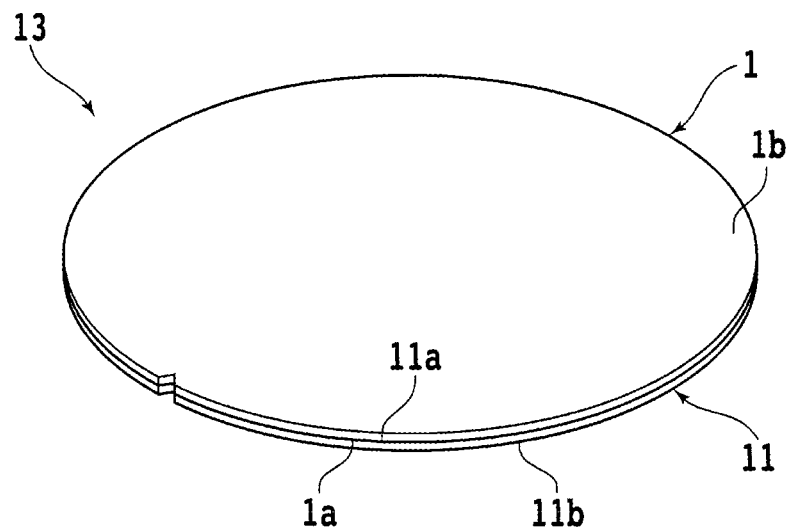
FIG. 3B is a perspective view schematically illustrating a joined wafer formed through the joining step of FIG. 3A.

In the processing method of the present embodiment, a joining step S30 is performed after the hydrophilization step S20. A description will next be made with regard to the joining step S30. FIG. 3A is a perspective view schematically illustrating the joining step S30, and FIG. 3B is a perspective view schematically illustrating a joined wafer 13 formed through the joining step S30. In the joining step S30, the front surface 1a of the wafer 1 and the support surface 11a of the support substrate 11 are brought to face each other as illustrated in FIG. 3A. FIG. 3A illustrates a case in which the wafer 1 is arranged above the support substrate 11, but the support substrate 11 may be arranged above the wafer 1. The wafer 1 is then brought closer to the support substrate 11, so that the front surface 1a of the wafer 1 is brought into contact with the support surface 11a of the support substrate 11.

Now, hydrogen bonds are formed between the front surface 1a of the wafer 1 and the support surface 11a of the support substrate 11 via the hydroxyl groups formed on the at least one of the front surface 1a or the support surface 11a in the hydrophilization step S20. The front surface 1a and the support surface 11a are hence joined together, so that the joined wafer 13 is formed. It is to be noted that the number of hydrogen bonds to be formed between the front surface 1a and the support surface 11a varies according to the number of hydroxyl groups formed in the hydrophilization step S20. A joint strength between the wafer 1 and the support substrate 11 therefore varies according to the intensity of the hydrophilic treatment performed in the hydrophilization step S20. Especially when the front surface 1a of the wafer 1 and the support surface 11a of the support substrate 11 have been both subjected to the hydrophilic treatment in the hydrophilization step S20, hydrogen bonds are relatively easily formed between hydroxyl groups formed on the front surface 1a and those formed on the support surface 11a. A high joint strength is therefore obtained between the wafer 1 and the support substrate 11.

Figure 4:
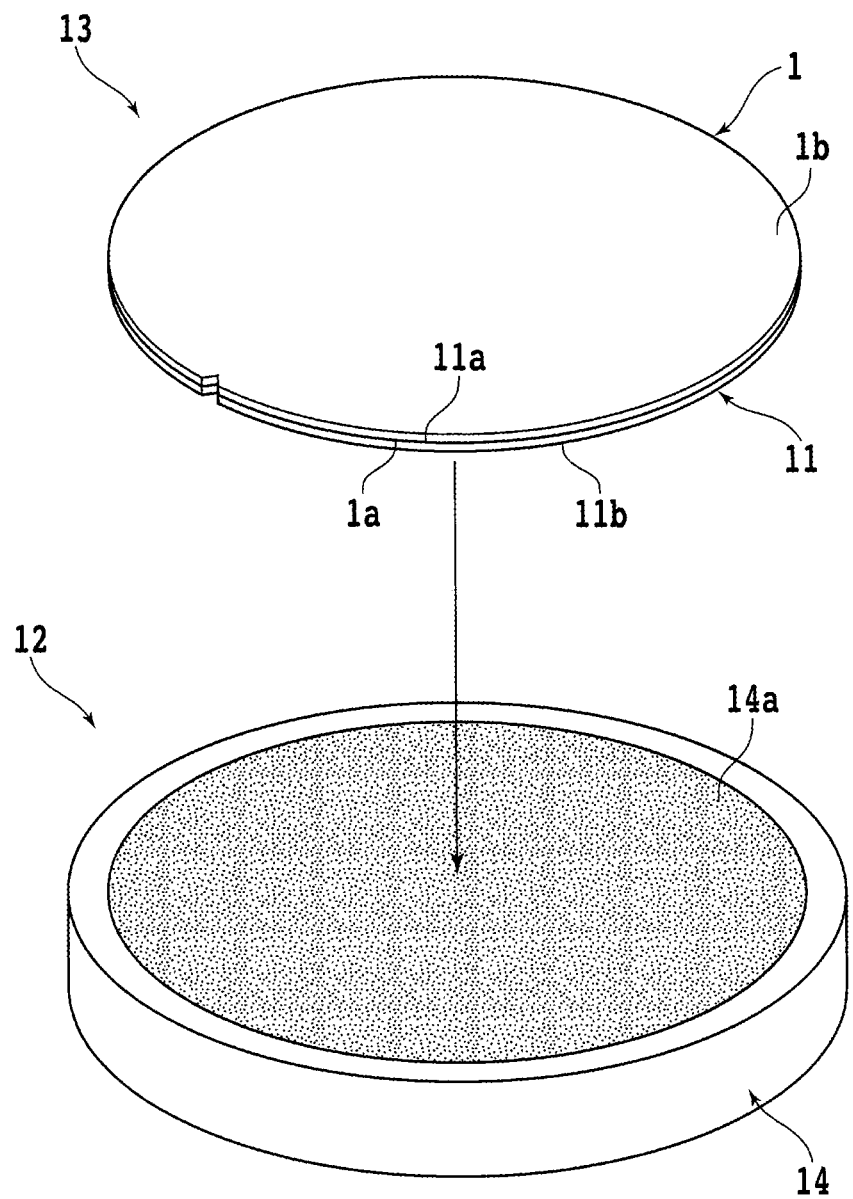
FIG. 4 is a perspective view schematically illustrating a first example of a first heating step in the processing method.

Next, a first heating step S40 is performed to heat the joined wafer 13 to a first temperature, thereby increasing the joint strength between the wafer 1 and the support substrate 11. FIG. 4 is a perspective view schematically illustrating a first example of the first heating step S40. In the first heating step S40, a heating device 12 including, for example, a heating and holding table 14 with a built-in heater is used. The heating and holding table 14 included in the heating device 12 includes a porous member, which has a diameter substantially equal to that of the joined wafer 13 and is exposed on an upper surface of the heating and holding table 14. Inside the heating and holding table 14, a suction channel is formed communicating at one end thereof to the porous member and at the other end thereof to a suction source (not illustrated). An upper surface of the porous member serves as a holding surface 14a, on which the joined wafer 13 is placed and is to be held by suction. The heater (not illustrated) built in the heating and holding table 14 is configured with an electric heating wire or the like. In the first heating step S40, the joined wafer 13 is placed on the holding surface 14a of the heating and holding table 14, and the suction source is activated to hold the joined wafer 13 on the holding surface 14a by suction. The heater is then activated to transmit heat to the joined wafer 13, and the joined wafer 13 is heated to the first temperature.

If the at least one of the wafer 1 or the support substrate 11 has been subjected to the hydrophilic treatment and the joined wafer 13 has been formed via hydrogen bonds, the joint strength between the wafer 1 and the support substrate 11 is improved when the joined wafer 13 is heated to a certain level of temperature. This is attributed to the fact that the hydroxyl groups which form the hydrogen bonds play a role to trigger a dehydrocondensation reaction and form bonds of covalent nature via oxygen atoms between the front surface 1a and the support surface 11a. These bonds are stronger than the hydrogen bonds. When the first heating step S40 is performed, the joint strength of the joined wafer 13 is improved, so that the wafer 1 remains hard to be separated from the support substrate 11 when the wafer 1 is processed in a processing step S50 to be described next. In the processing method of the present embodiment, it is therefore also necessary to appropriately determine heating conditions for the joined wafer 13 in the first heating step S40 in addition to the conditions for the hydrophilic treatment in the hydrophilization step S20. Preferred ranges of the conditions for the hydrophilic treatment and the first temperature will be described later in detail.

Figure 5A:
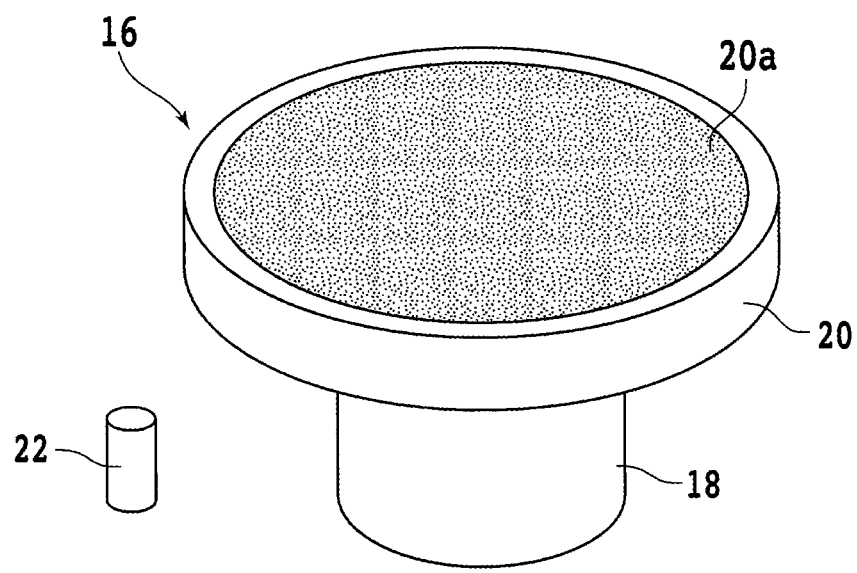
FIG. 5A is a perspective view schematically illustrating a laser annealing unit and a holding table for use in a second example of the first heating step.

The first heating step S40 may be performed in a manner other than the heating by the heating device 12 that includes the heating and holding table 14. A description will next be made with regard to a second example of the first heating step S40. FIG. 5A is a perspective view schematically illustrating a laser annealing unit 22 and a holding table 20 for use in the second example of the first heating step S40, and FIG. 5B is a perspective view schematically illustrating the second example (hereinafter called a "modification") of the first heating step S40.

The holding table 20 illustrated in FIG. 5A includes a porous member exposed on an upper surface of the holding table 20 and a suction channel (not illustrated) that supplies a negative pressure to the porous member. An upper surface of the porous member serves as a holding surface 20a for the joined wafer 13. When the joined wafer 13 is placed on the holding surface 20a and the negative pressure is caused to act on the joined wafer 13 through the porous member, the joined wafer 13 can be held by suction on the holding table 20. The holding table 20 is supported on a table rotating shaft 18 connected to a rotary drive source (not illustrated) such as a motor. When this rotary drive source is activated, the holding table 20 can be rotated along with the holding surface 20a about an axis of rotation. The holding table 20 may also include cooling water channels (not illustrated) internally. The holding table 20 can be maintained at a predetermined temperature by allowing cooling water to flow through the cooling water channels. The upper surface (specifically, the holding surface 20a) of the holding table 20 has a diameter set smaller than that of the joined wafer 13. When the joined wafer 13 is held by suction on the holding table 20, an outer peripheral region of the joined wafer 13 protrudes outside the holding surface 20a. When the cooling water is allowed to flow through the cooling water channels with the joined wafer 13 held by suction on the holding table 20, the temperature of the joined wafer 13 is maintained constant with ease in a region where the joined wafer 13 is in contact with the holding surface 20a.

A description will next be made with regard to the laser annealing unit 22. The laser annealing unit 22 is arranged outside the holding table 20 and at a position lower than the holding surface 20a of the holding table 20. The laser annealing unit 22 includes a laser oscillator such as a $CO_2$ laser oscillator or a neodymium-doped yttrium aluminum garnet (Nd:YAG) laser oscillator, and can discharge a laser beam of a predetermined wavelength.

Figure 5B:
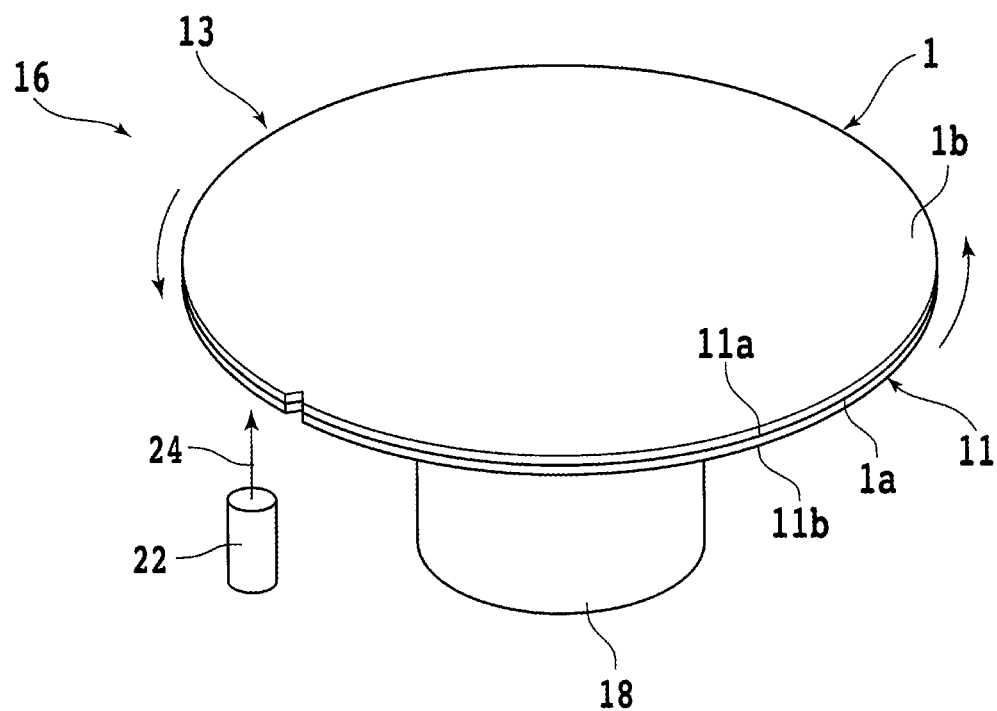
FIG. 5B is a perspective view schematically illustrating the second example of the first heating step.

As illustrated in FIG. 5B, in the modification of the first heating step S40, the joined wafer 13 is placed on the holding surface 20a of the holding table 20, and joined wafer 13 is held by suction on the holding table 20. At this time, the outer peripheral region of the joined wafer 13 protrudes outside the holding surface 20a. While the holding table 20 is rotated by rotating the table rotating shaft 18 with the joined wafer 13 held by suction on the holding table 20, a laser beam 24 is applied from the laser annealing unit 22 to the outer peripheral region of the joined wafer 13. As a consequence, the outer peripheral region of the joined wafer 13 is heated to the first temperature. If the hydrophilic treatment is applied to only the outer peripheral region 7 or the like of the front surface 1a of the wafer 1 in the hydrophilization step S20, it is unnecessary to heat a central region of the joined wafer 13. On the other hand, depending on the details of structures formed on the front surface 1a of the wafer 1, a problem may arise if the central region of the wafer 1 is heated to the first temperature. If the holding table 20 includes the cooling water channels that allow cooling water to flow, the cooling water is preferably kept flowing through the cooling water channels. In this case, the temperature of the joined wafer 13 is less likely to rise on an inner side thereof surrounded by the outer peripheral region.

In the processing method of the present embodiment, the processing step S50 is performed after the first heating step S40 to process the wafer 1 included in the joined wafer 13, from a side of the back surface 1b. In other words, the wafer 1 supported on the support substrate 11 is processed in the processing step S50. No limitations are imposed on the processing to be performed on the wafer 1 in the processing step S50. For example, the wafer 1 is ground and thinned from the back surface 1b in the processing step S50. Taking as an example a case in which the processing to be performed in the processing step S50 is grinding, a description will hereinafter be made with regard to the processing step S50, although the processing step S50 is not limited to the grinding.

Figure 6:
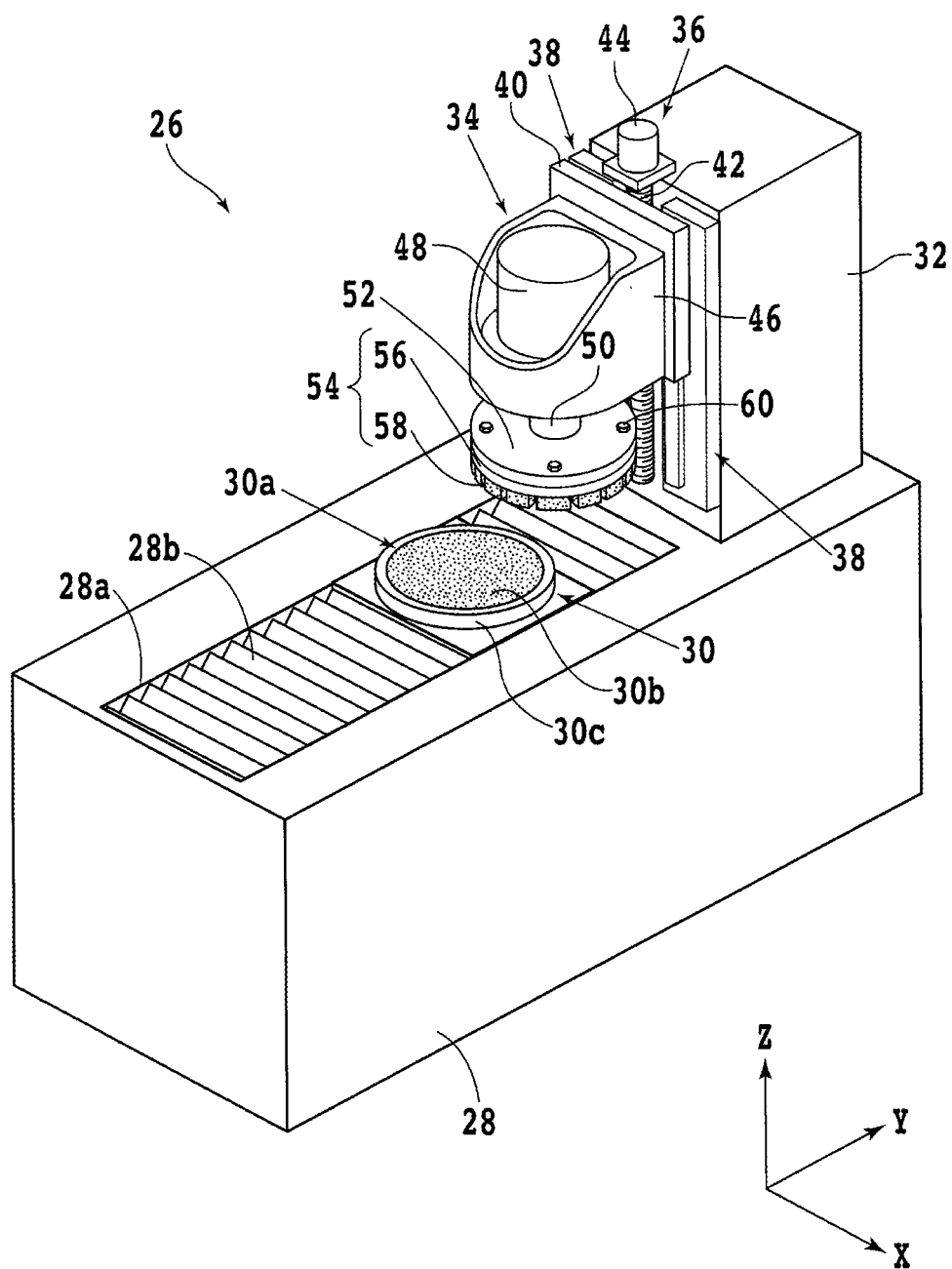
FIG. 6 is a perspective view schematically illustrating a processing machine for use in a processing step of the processing method.

A description will first be made with regard to a processing machine that processes the wafer 1. FIG. 6 is a perspective view schematically illustrating a processing machine (grinding machine) 26 for processing (grinding) the wafer 1 as a workpiece. The processing machine 26 includes a bed 28 that supports individual elements. In an upper surface of the bed 28, a cavity 28a is formed along a Y-axis direction. Disposed in the cavity 28a are a holding table 30 that can be moved along the Y-axis direction by a ball screw type moving mechanism and a dust- and splash-proof cover 28b that covers the cavity 28a with the holding table 30 exposed therethrough.

The holding table 30 can hold by suction the joined wafer 13 that includes the wafer 1 to be ground. The holding table 30 has a frame body 30c made of stainless steel or ceramics. A suction passage (not illustrated) is disposed inside the frame body 30c, and a suction source (not illustrated) such as an ejector is connected to one end of the suction passage. The frame body 30c has, on a side of an upper surface thereof, a recessed portion defining a disk-shaped space therein. A substantially disk-shaped porous member 30a is accommodated and fixed in the recessed portion. The porous member 30a has substantially the same diameter as that of the support substrate 11. An upper surface of the porous member 30a serves as a holding surface 30b. When the joined wafer 13 is placed on the porous member 30a and the suction source is activated, a negative pressure acts on the joined wafer 13 through the suction passage and the porous member 30a, and therefore, the joined wafer 13 is held by suction on the holding table 30.

The holding table 30 is moved along the Y-axis direction by the ball screw type moving mechanism disposed inside the cavity 28a and covered by the dust- and splash-proof cover 28b. The ball screw type moving mechanism has a ball screw that is rotated by a rotary drive source such as a motor. The holding table 30 is also connected to a rotary drive source (not illustrated) such as a motor, and can be rotated about an axis 30d of table rotation (see FIG. 7) perpendicular to the holding surface 30b.

The processing machine 26 includes a processing unit (grinding unit) 34 that processes (grinds) the wafer 1 included in the joined wafer 13 held on the holding table 30 and a processing feed unit 36 that lifts and lowers the processing unit 34. On a rear side of the processing machine 26, a column 32 is disposed upright, and the processing unit 34 is supported by the column 32 via the processing feed unit 36. On a front surface of the column 32, a pair of guide rails 38 are disposed along a Z-axis direction (vertical direction). A lift plate 40 is slidably attached to the respective guide rails 38.

On a side of a back surface (on a side of a rear surface) of the lift plate 40, a nut portion (not illustrated) is disposed, and a ball screw 42 that is parallel to the guide rails 38 is in threaded engagement with the nut portion. A pulse motor 44 is connected to one end portion of the ball screw 42. When the ball screw 42 is rotated by the pulse motor 44, the lift plate 40 is moved in the Z-axis direction along the guide rails 38. On a side of a front surface of the lift plate 40, the processing unit 34 is fixed to perform grinding processing of the wafer 1. When the lift plate 40 is moved, the processing unit 34 can be moved in the Z-axis direction (grinding feed direction). The processing unit 34 has a truncated cylindrical support bracket 46. The support bracket 46 is fixed on the side of the front surface of the lift plate 40, and serves as an outer casing for the processing unit 34. On an inner side of the support bracket 46, a spindle housing 48 is disposed in such a manner as to be supported by the support bracket 46. In the spindle housing 48, a portion of a spindle 50 is accommodated in a rotatable manner. To an upper end of the spindle 50, a rotary drive mechanism (not illustrated) such as a motor is connected. When this rotary drive mechanism is activated, the spindle 50 is rotated about an axis of rotation.

Figure 7:
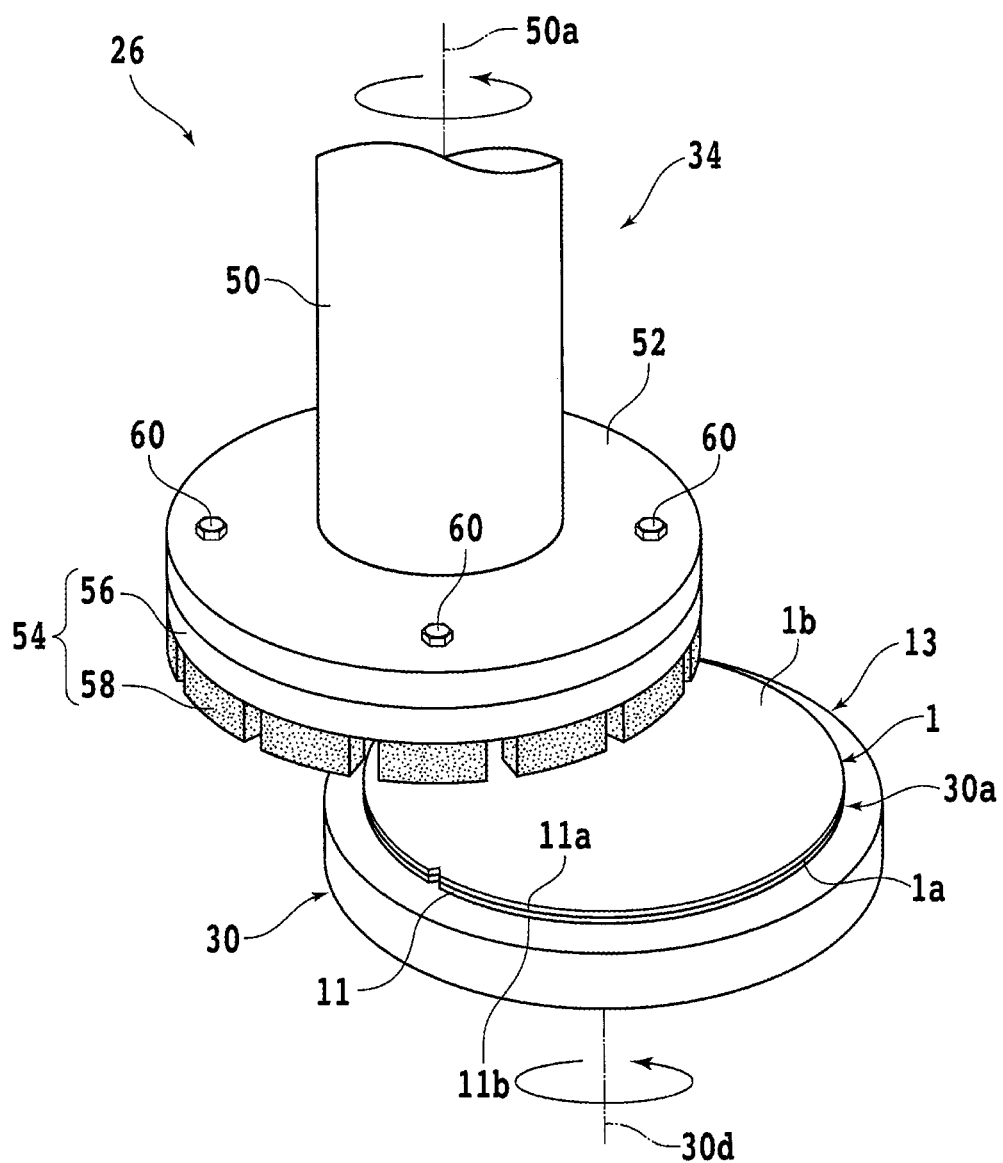
FIG. 7 is a perspective view schematically illustrating the processing step.

A lower end of the spindle 50 is located lower than a bottom portion of the support bracket 46. To the lower end of the spindle 50, a disk-shaped wheel mount 52 is connected on a side of an upper surface thereof. On the wheel mount 52, a grinding wheel (processing tool) 54 is fixed. FIG. 7 is a perspective view schematically illustrating how the wafer 1 is processed (ground) by the grinding wheel 54 fixed on the wheel mount 52. The grinding wheel (processing tool) 54 has an annular wheel base 56. The wheel base 56 is formed with such metal as aluminum, and has a diameter corresponding to that of the wafer 1. On an outer peripheral portion on a side of a lower surface (bottom surface) of the wheel base 56, a plurality of grinding stones 58 arrayed in an annular pattern are disposed. Each grinding stone 58 has been formed, for example, by mixing abrasive grits such as diamond or cubic boron nitride (cBN) with a bonding material such as a vitrified bond or a resinoid, pressing the resulting mixture into a green compact, and then sintering the green compact.

The wheel mount 52 is provided with a plurality of grinding wheel fixing holes extending vertically therethrough, and a like plurality of fastening holes, into which fasteners 60 such as bolts are to be fastened, are formed in the wheel base 56. When the fasteners 60 are inserted through the grinding wheel fixing holes and are fastened into the fastening holes, the grinding wheel 54 is fixed on the wheel mount 52. At this time, the wheel mount 52 supports the grinding wheel 54 from above.

In the processing step S50, the joined wafer 13 is placed on the holding table 30, and the joined wafer 13 is held by suction on the holding table 30. At this time, the back surface 11b of the support substrate 11 is brought to face the holding surface 30b, and the back surface 1b of the wafer 1 is exposed upwards. The holding table 30 is next moved to below the processing unit 34. After that, the rotary drive source connected to the spindle 50 is activated to rotate the spindle 50 about an axis 50a of wheel rotation. The grinding wheel 54 is then rotated, so that the grinding stones 58 move on a rotary track. The holding table 30 is also rotated about the axis 30d of table rotation. The processing feed unit 36 is then activated to lower the processing unit 34, and the grinding stones 58 that are moving on the rotary track are thereby brought at bottom surfaces thereof into contact with the to-be-ground surface (back surface 1b) of the wafer 1. The wafer 1 is therefore ground, so that the wafer 1 is gradually thinned. During this grinding, the thickness of the wafer 1 is monitored, and the lowering of the processing unit 34 is completed when the wafer 1 has been thinned to a predetermined thickness. The wafer 1 thinned to the predetermined thickness is hence obtained.

In the processing method of the present embodiment, the wafer 1 is supported on the support substrate 11 without interposition of any adhesive material. The wafer 1 is therefore free of thickness variations or the like which would be prone to occur if an adhesive layer were included. Further, the wafer 1 can be ground to an extremely small thickness as the wafer 1 is supported on the support substrate 11. In addition, the wafer 1 is not separated from the support substrate 11 during processing because the joint strength between the wafer 1 and the support substrate 11 has been increased through the hydrophilization step S20 and the first heating step S40.

Figure 8A:
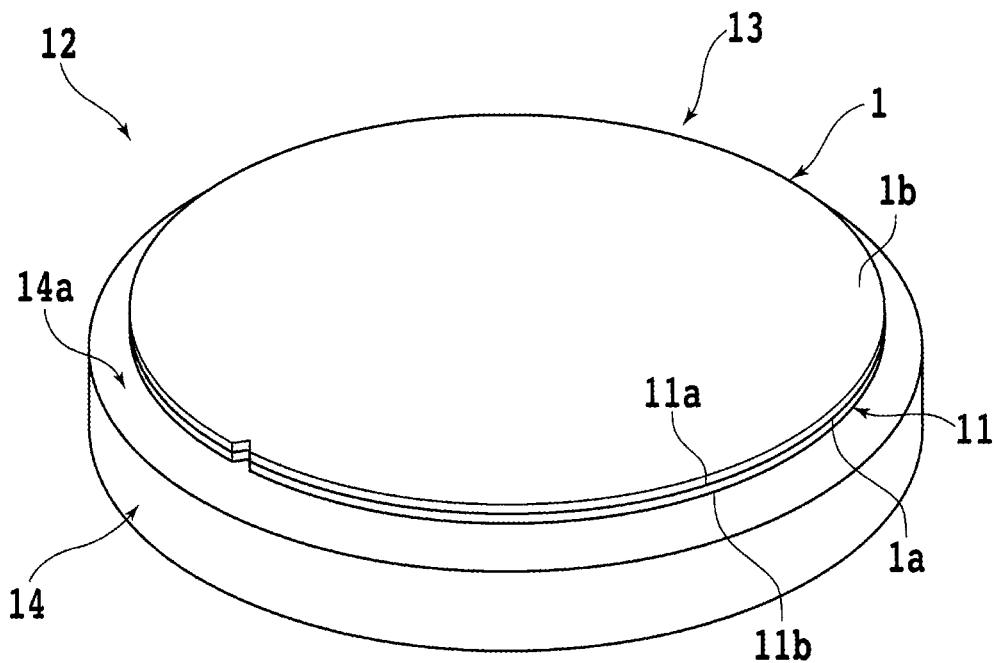
FIG. 8A is a perspective view schematically illustrating a first example of a second heating step in the processing method.
Figure 8B:
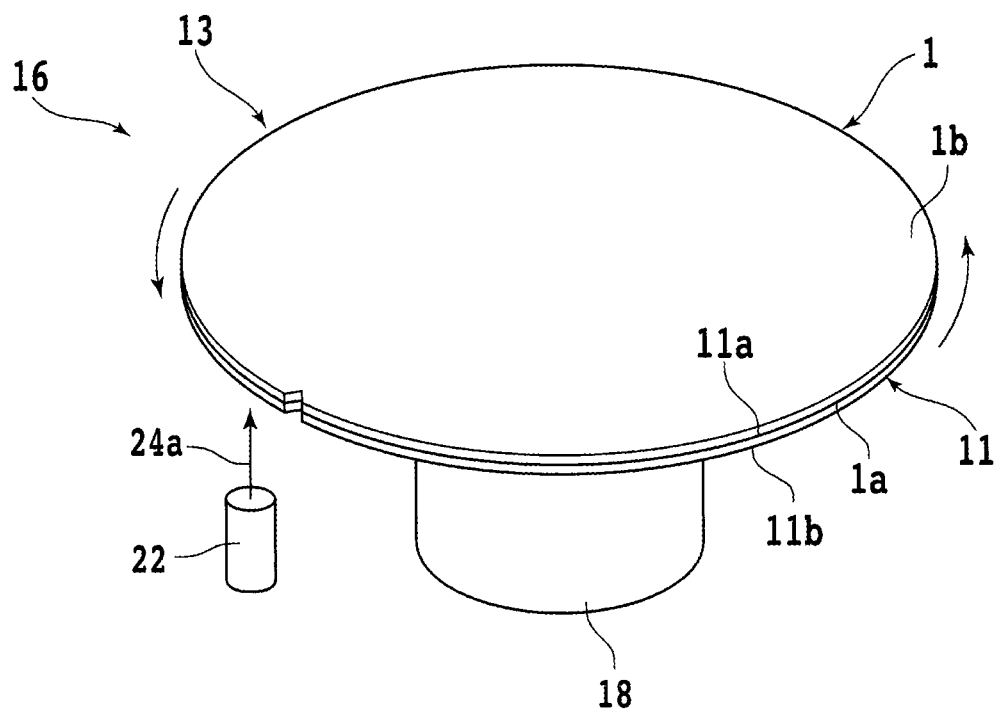
FIG. 8B is a perspective view schematically illustrating a second example of the second heating step.

In the processing method of the present embodiment, the support substrate 11 is separated from the processed wafer 1. As a preparation for separating the wafer 1, a second heating step S60 is performed after the processing step S50 to heat the joined wafer 13 to a second temperature and reduce the joint strength between the wafer 1 and the support substrate 11. The second heating step S60 can be performed similarly to the first heating step S40. The description made above with regard to the first heating step S40 can therefore be referred to as needed as a description of the second heating step S60. FIG. 8A is a perspective view schematically illustrating a first example of the second heating step S60, and FIG. 8B is a perspective view schematically illustrating a second example of the second heating step S60. In the second heating step S60, the heating device 12 or the laser annealing unit 22 can be used as in the first heating step S40.

A principal difference of the second heating step S60 from the first heating step S40 exists in the temperature at which the joined wafer 13 is heated. Described specifically, the second temperature that serves as a target to which the joined wafer 13 is heated in the second heating step S60 is set higher than the first temperature that serves as a target to which the joined wafer 13 is heated in the first heating step S40. Described in more detail, the first temperature is preferably 150° C. or higher and lower than 250° C., and the second temperature is preferably 250° C. or higher and 350° C. or lower.

When the heating device 12 is used in the second heating step S60 as illustrated in FIG. 8A, the built-in heater is activated under conditions with which the joined wafer 13 can be heated to the second temperature. When the laser annealing unit 22 is used in the second heating step S60, on the other hand, a laser beam 24a that can heat the outer peripheral region of the joined wafer 13 to the second temperature is applied to the joined wafer 13 as illustrated in FIG. 8B.

Here, a description will be made with regard to a phenomenon that occurs on the joined wafer 13 in the second heating step S60. When the joined wafer 13 is heated to a temperature (second temperature) still higher than the first temperature at which such a dehydrocondensation reaction as described in the first heating step S40 occurs between the wafer 1 and the support substrate 11, some organic molecules that still remain between the wafer 1 and the support substrate 11 are gasified. As a result, gas bubbles are generated in a joint interface between the wafer 1 and the support substrate 11, so that the joint strength between the wafer 1 and the support substrate 11 is reduced. Therefore, these gas bubbles act as a trigger for separation.

Conversely speaking, if the temperature at which the joined wafer 13 is heated in the first heating step S40 is excessively high, not only the dehydrocondensation reaction but also gas bubbles are generated in the joint interface between the wafer 1 and the support substrate 11. No sufficient joint strength may hence be achieved at the completion of the first heating step S40. Accordingly, in the first heating step S40, the joined wafer 13 needs to be heated to a temperature at which gas bubbles are difficult to be generated, and in the second heating step S60, the joined wafer 13 needs to be heated to a temperature at which gas bubbles are generated with ease. In other words, in the first heating step S40, the joined wafer 13 needs to be heated at the first temperature lower than the second temperature, and in the second heating step S60, the joined wafer 13 needs to be heated at the second temperature higher than the first temperature.

Figure 9:
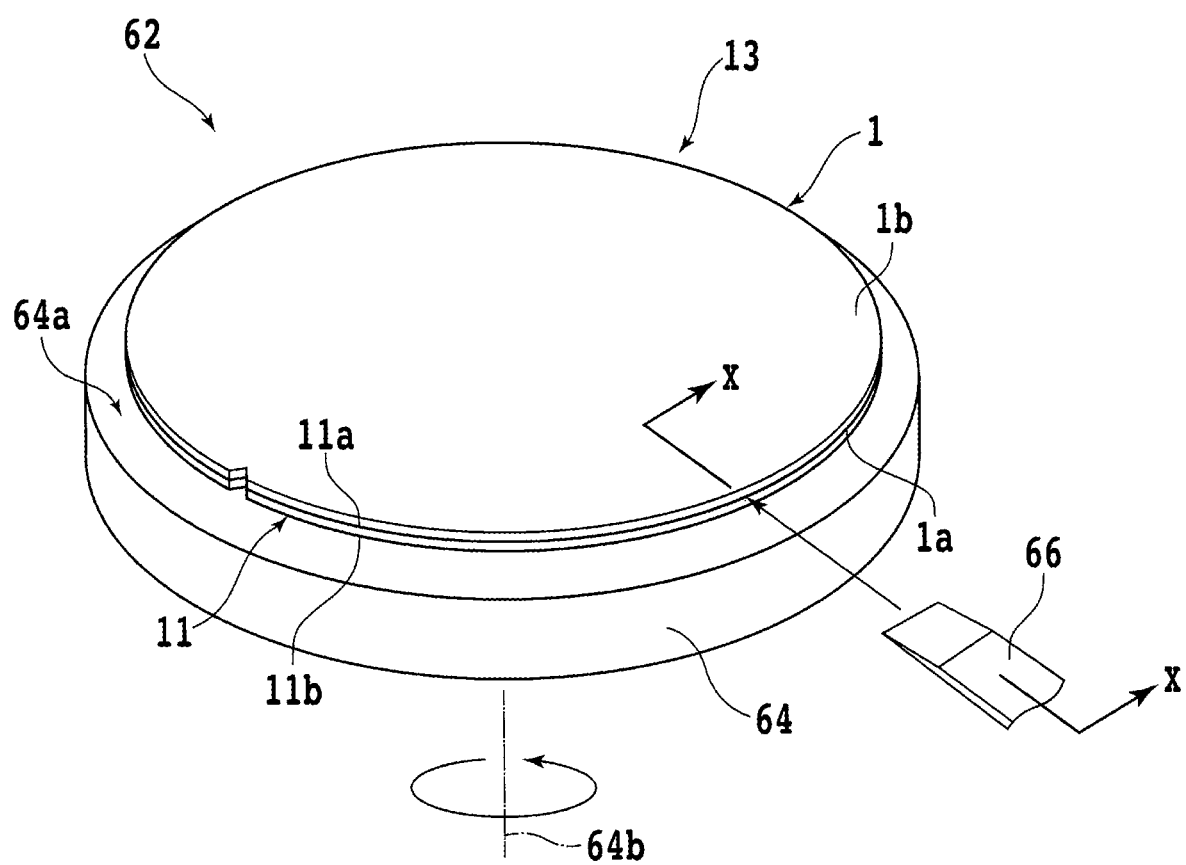
FIG. 9 is a perspective view schematically illustrating a separation step in the processing method.
Figure 10:
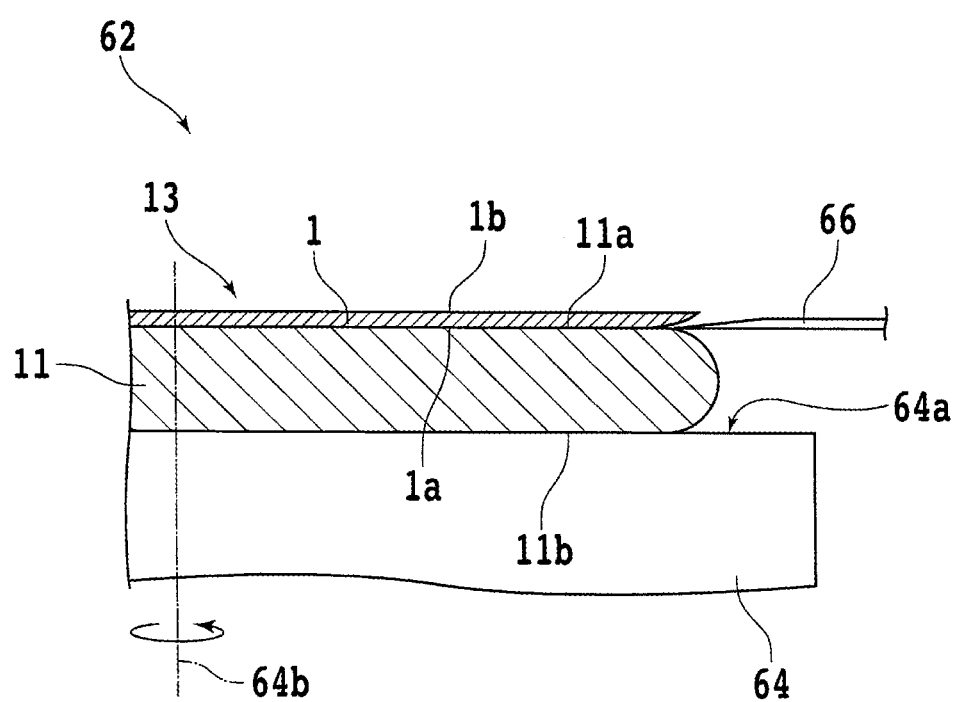
FIG. 10 is a fragmentary cross-sectional view that is taken along line X-X of FIG. 9 and schematically illustrates the separation step shortly before inserting a separator blade into between the wafer and the support substrate of the joined wafer.

In the processing method of the present embodiment, a separation step S70 is performed after the second heating step S60 to separate the wafer 1 from the support substrate 11. FIG. 9 is a perspective view schematically illustrating the separation step S70, and FIG. 10 is a fragmentary cross-sectional view that is taken along line X-X of FIG. 9 and schematically illustrates the separation step S70 shortly before inserting a separator blade 66 into between the wafer 1 and the support substrate 11 of the joined wafer 13. The separation step S70 is performed, for example, by a separating machine 62 schematically illustrated in FIGS. 9 and 10.

The separating machine 62 includes a holding table 64 that holds the joined wafer 13 by suction. An upper surface of the holding table 64 serves as a holding surface 64a, and the holding table 64 can hold by suction the joined wafer 13 placed on the holding surface 64a. The holding table 64 is connected to a rotary drive source (not illustrated) such as a motor, and therefore is rotatable about an axis of rotation that is perpendicular to the holding surface 64a. With the separating machine 62, the separator blade 66 is used for insertion, from a side of an outer periphery of the joined wafer 13, into between the wafer 1 and the support substrate 11 of the joined wafer 13 which is held on the holding table 64. The separator blade 66 is a plate-shaped member formed progressively thinner from an intermediate portion toward a tip thereof, and is formed with a resin material or a metal material.

In the separation step S70, the joined wafer 13 is held by suction on the holding table 64, and a tip portion of the separator blade 66 is inserted into between the wafer 1 and the support substrate 11 of the joined wafer 13. From the support substrate 11, the wafer 1 is now easily separated at a portion thereof where the separator blade 66 has been inserted, because the joint strength between the wafer 1 and the support substrate 11 has been reduced through the second heating step S60. When the holding table 64 is rotated about an axis 64b of table rotation with the separator blade 66 inserted between the wafer 1 and the support substrate 11, the separated region between the wafer 1 and the support substrate 11 is caused to gradually spread by the separator blade 66. When the separator blade 66 is gradually pushed toward a center of the joined wafer 13 in the course of this rotation of the holding table 64, the joining of the front surface 1a of the wafer 1 with the support surface 11a of the support substrate 11 is finally released over the entire area of the front surface 1a. In other words, the separation of the wafer 1 from the support substrate 11 is completed, so that the processed wafer 1 is obtained.

As the joint strength between the wafer 1 and the support substrate 11 is reduced when the second heating step S60 has been performed, no large force is needed when the separation step S70 is subsequently performed to separate the wafer 1 from the support substrate 11. No large force therefore acts on the wafer 1 upon separation of the wafer 1, damage to the wafer 1 due to separation work is extremely unlikely to occur.

As described above, the processing method of the present embodiment performs the hydrophilic treatment in advance on the at least one of the front surface 1a of the wafer 1 or the support surface 11a of the support substrate 11, brings the front surface 1a of the wafer 1 and the support surface 11a of the support substrate 11 to face each other, and after that, joins them together to form the joined wafer 13. The processing method of the present embodiment further processes the wafer 1 included in the joined wafer 13, from the side of the back surface 1b, and then separates the wafer 1 from the support substrate 11. According to this method, the wafer 1 can be supported by the support substrate 11 without using any adhesive material. The wafer 1 supported on the support substrate 11 can therefore be processed without the occurrence of reductions in the thickness homogeneity and planarity, which would occur if an adhesive material layer were included. Accordingly, the wafer 1 joined with the support substrate 11 can be processed in such a manner as to be provided with a high planarity.

Now, a description will be made with regard to correlations between conditions for the atmospheric pressure plasma irradiation to be performed in the hydrophilization step S20 and the hydrophilicity of the front surface 1a or the like of the wafer 1 irradiated with atmospheric pressure plasma. A description will also be made with regard to a preferred range of the hydrophilicity of the front surface 1a or the like of the wafer 1.

If, in the hydrophilization step S20, the intensity of the atmospheric pressure plasma irradiation is excessively high and the hydrophilicity of the front surface 1a or the like of the wafer 1 is increased too much, the joint strength between the wafer 1 and the support substrate 11 becomes excessively high at the stage that the joining step S30 and the first heating step S40 have been performed. In this case, even when the second heating step S60 is performed after the processing step S50, the joint strength cannot be reduced sufficiently, so that it is difficult to separate the wafer 1 from the support substrate 11 in the separation step S70. Conversely, if the intensity of the atmospheric pressure plasma irradiation is excessively low and the hydrophilicity of the front surface 1a or the like of the wafer 1 is not increased, the joint strength between the wafer 1 and the support substrate 11 may become insufficient even when the joining step S30 and the first heating step S40 are performed. If this is the case, the wafer 1 may be separated from the support substrate 11 while the processing step S50 is performed.

In other words, an optimal joint strength is obtained between the wafer 1 and the support substrate 11 by appropriately adjusting the conditions for the atmospheric pressure plasma irradiation to be performed as the hydrophilic treatment in the hydrophilization step S20 in the processing method of the present embodiment. Here, a description will be made with regard to an experiment on the correlations between the conditions for the atmospheric pressure plasma irradiation and the hydrophilicity (wettability) of the front surface 1a or the like of the wafer 1. In the experiment, atmospheric pressure plasma was applied to silicon wafers which were each usable as the wafer 1 or the support substrate 11, under varied irradiation conditions, and the regions irradiated with atmospheric pressure plasma were evaluated for wettability. The irradiation with the atmospheric pressure plasma was performed by the atmospheric pressure plasma irradiation device 2 described above with reference to FIG. 2. The varied irradiation conditions are a distance from the plasma irradiation unit 8 to the wafer 1, in other words, an irradiation distance, and irradiation time of atmospheric pressure plasma. The evaluation of hydrophilicity was performed by dropping pure water to the irradiated region of each wafer 1 and measuring the contact angle between the pure water and the front surface 1a of the wafer 1.

Figure 11:
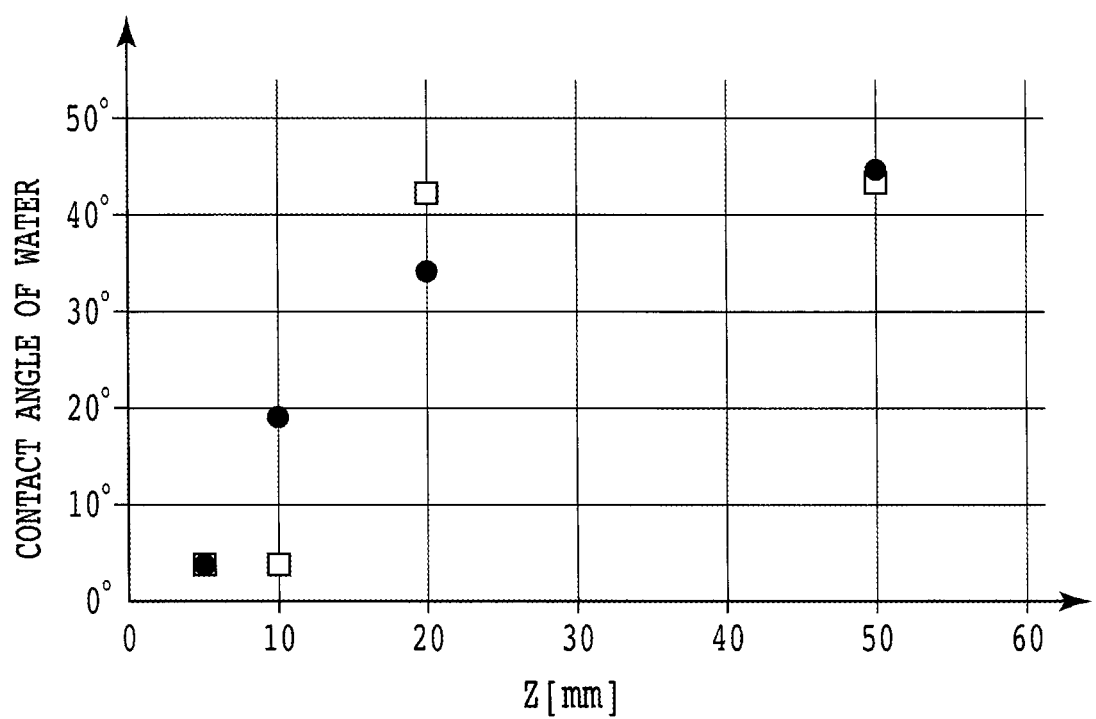
FIG. 11 is a graph illustrating examples of correlations between conditions for a hydrophilic treatment and wettability.

In this experiment, the distance (Z) from the plasma irradiation unit 8 to the wafer 1 was set to 5 mm, 10 mm, 20 mm, or 50 mm. On the other hand, the irradiation time of atmospheric pressure plasma was set to 3 seconds or 10 seconds. FIG. 11 is a graph illustrating correlations between the distance (Z) from the plasma irradiation unit 8 to the wafer 1 and the contact angle of water. Plots of filled circles in the graph represent the irradiation time of 3 seconds, while plots of open squares in the graph represent the irradiation time of 10 seconds. As illustrated in the graph, for the irradiation time of 3 seconds, the contact angle was 3° at the irradiation distance of 5 mm, 18° at the irradiation distance of 10 mm, 34° at the irradiation distance of 20 mm, and 45° at the irradiation distance of 50 mm. For the irradiation time of 10 seconds, on the other hand, the contact angle was 3° at the irradiation distance of 5 mm, 3° at the irradiation distance of 10 mm, 42° at the irradiation distance of 20 mm, and 43° at the irradiation distance of 50 mm. Further, the contact angle was 52° before the irradiation with atmospheric pressure plasma. As illustrated in the graph, with the irradiation time and the irradiation distance of atmospheric pressure plasma, the contact angle of water has been confirmed to significantly change, and the hydrophilicity of a region irradiated with atmospheric pressure plasma has also been found to substantially change.

It is to be noted that, when the contact angle was 52°, no sufficient joint strength was obtained even when a joined wafer was formed from a wafer of the same kind as those used in the experiment. Further, when the contact angle was 3°, formation of a joined wafer from another wafer of the same kind as those used in the experiment led to an excessively high joint strength, so that it was difficult to separate the wafer even when the joined wafer was heated later. When the irradiation time of atmospheric pressure plasma is set to 3 seconds, it is therefore considered preferred to set the irradiation distance of atmospheric pressure plasma to 10 mm or longer. When the irradiation time of atmospheric pressure plasma is set to 10 seconds, on the other hand, it is considered preferred to set the irradiation distance of atmospheric pressure plasma to 20 mm or longer. However, the irradiation time and the irradiation distance of atmospheric pressure plasma are not limited to those described above. Described from a different viewpoint, the contact angle between the at least one of the front surface 1a of the wafer 1 or the support surface 11a of the support substrate 11, the at least one surface having been subjected to the hydrophilic treatment, and the dropped pure water is considered to be preferably 10° or greater and 50° or smaller, with 18° or greater and 45° or smaller being more preferred.

It is to be noted that the present invention can be practiced with various modifications without limitations by the foregoing description of the embodiment. In the embodiment described above, the description is made, for example, with regard to the case in which the wafer 1 of the joined wafer 13 is ground from the side of the back surface 1b in the processing step S50, although the aspect of the present invention is not limited to such a case. In the processing step S50, the wafer 1 supported on the support substrate 11 may be ground, for example, from the side of the back surface 1b. In the processing step S50, the wafer 1 supported on the support substrate 11 may also be divided along the scribe lines 3 by such a method as dicing or laser processing.

In the embodiment described above, the description is also made with regard to the case in which, in the separation step S70, the joined wafer 13 is held on the holding table 64 of the separating machine 62 and the wafer 1 is separated from the support substrate 11, although the aspect of the present invention is not limited to such a case. For example, a self-adhesive tape of a diameter greater than that of the wafer 1 is bonded to the back surface 1b of the wafer 1 of the joined wafer 13 after completion of the processing step S50, and after supporting the joined wafer 13 with the self-adhesive tape, the wafer 1 may be separated from the support substrate 11. In this case, the wafer 1 separated from the support substrate 11 is supported on the self-adhesive tape even if the wafer 1 is processed to an extremely small thickness, so that handling of the wafer 1 is facilitated. Further processing can then be easily applied to the wafer 1 supported on the self-adhesive tape.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a wafer having a front surface and a back surface on a side opposite to the front surface, the method comprising:
   a providing step of providing a support substrate having a support surface that supports the wafer;
   a hydrophilization step of performing a hydrophilic treatment on at least one of the front surface of the wafer or the support surface of the support substrate;
   a joining step of, after the hydrophilization step, bringing the front surface of the wafer and the support surface of the support substrate to face each other, and joining the front surface and the support surface together to form a joined wafer;
   a first heating step of heating the joined wafer to a first temperature, thereby increasing a joint strength between the wafer and the support substrate;

a processing step of, after the first heating step, processing the wafer included in the joined wafer, from a side of the back surface;

a second heating step of, after the processing step, heating the joined wafer to a second temperature higher than the first temperature, thereby reducing the joint strength between the wafer and the support substrate; and a separation step of, after the second heating step, separating the wafer from the support substrate.

2. The processing method according to claim 1, wherein, in the hydrophilization step, the at least one of the front surface of the wafer or the support surface of the support substrate, the at least one surface having been subjected to the hydrophilic treatment, has a contact angle of 10° or greater and 50° or smaller with dropped pure water.

3. The processing method according to claim 1, wherein, in the hydrophilization step, the hydrophilic treatment is performed in an outer peripheral region of the at least one of the front surface of the wafer or the support surface of the support substrate, and the hydrophilic treatment is not performed on an inner side of the outer peripheral region.

4. The processing method according to claim 1, wherein, in the first heating step, the joined wafer is heated in an outer peripheral region thereof.

5. The processing method according to claim 4, wherein, in the second heating step, the joined wafer is heated in the outer peripheral region thereof.

6. The processing method according to claim 1, wherein the hydrophilization step applies the hydrophilic treatment by bringing plasma that has been generated under atmospheric pressure, into contact with the at least one of the front surface of the wafer or the support surface of the support substrate.

7. The processing method according to claim 1, wherein the support surface of the support substrate has a profile corresponding to the front surface of the wafer.

8. The processing method according to claim 1, wherein the first temperature is 150° C. or higher and lower than 250° C., and the second temperature is 250° C. or higher and 350° C. or lower.

* * * * *